United States Patent
Tai et al.

[11] Patent Number: 5,880,649
[45] Date of Patent: Mar. 9, 1999

[54] MULTILAYERED FREQUENCY SEPARATOR

[75] Inventors: Hiroyuki Tai; Tsuyoshi Taketa, both of Tottori-ken; Toshihiko Tanaka, Tottori, all of Japan

[73] Assignee: Hitachi Metals Ltd., Tokyo, Japan

[21] Appl. No.: 805,048

[22] Filed: Feb. 24, 1997

[30] Foreign Application Priority Data

| Feb. 27, 1996 | [JP] | Japan | 8-040102 |
| Sep. 20, 1996 | [JP] | Japan | 8-250729 |
| Sep. 20, 1996 | [JP] | Japan | 8-250730 |

[51] Int. Cl.$^6$ ............................. H01P 1/213; H03H 7/46
[52] U.S. Cl. ......................... 333/132; 333/134; 333/176
[58] Field of Search .................... 333/126, 129, 333/132, 134, 176, 185

[56] References Cited

U.S. PATENT DOCUMENTS

| 3,015,099 | 12/1961 | Willard | 343/180 |
| 4,186,359 | 1/1980 | Kaegebein | 333/134 |
| 4,382,238 | 5/1983 | Makimoto et al. | 333/134 |
| 4,910,481 | 3/1990 | Sasaki et al. | 333/134 |
| 5,285,728 | 2/1994 | Taniyoshi et al. | 333/132 |
| 5,515,015 | 5/1996 | Nakata | 333/132 |

FOREIGN PATENT DOCUMENTS

| 0641035A | 3/1995 | European Pat. Off. . | |
| 0675560A | 10/1995 | European Pat. Off. . | |
| 0149518 | 11/1980 | Japan | 333/132 |
| 56-40532 | 9/1981 | Japan . | |
| 62-16564 | 4/1987 | Japan . | |
| 3-216002 | 9/1991 | Japan . | |
| 3-244202 | 10/1991 | Japan . | |
| 3-272213 | 12/1991 | Japan | 333/134 |
| 4-207806 | 7/1992 | Japan | 333/132 |
| 4-304003 | 10/1992 | Japan | 333/132 |
| 5-167374 | 7/1993 | Japan | 333/176 |
| 6-85506 | 3/1994 | Japan | 333/202 |

OTHER PUBLICATIONS

Patent Abstracts of Japan, vol. 15, No. 494 (E–1145), 13 Dec. 1991 & JP 03 216002 A (Fuji Electrochem Co., Ltd), 24 Sep. 1991—Abstract.

Patent Abstracts of Japan, vol. 18, No. 340 (E–1569), 27 Jun. 1994 & JP 06 085506 A (Murata Mfg, Co., Ltd), 25 Mar. 1994—Abstract.

*Primary Examiner*—Seungsook Ham
*Attorney, Agent, or Firm*—Sughrue, Mion, Zinn, Macpeak & Seas, PLLC

[57] ABSTRACT

A multilayered frequency separator comprising a plurality of insulating layers, and having at least two notch circuits. The notch circuit is constituted by pattern electrodes formed on interfaces of each of the insulating layers which construct the multilayer structure, and comprises a capacitor component connected to an inductance component. The multilayered frequency separator is suitably used for branching the frequency bands for dual-band handy phone.

19 Claims, 7 Drawing Sheets

MULTILAYERED FREQUENCY SEPARATOR

BACKGROUND OF THE INVENTION

The present invention relates to a frequency separator for use in branching microwaves, specifically relates to a frequency separator for use in branching bands for dual-band handy phones.

FIG. 10 is a schematic diagram showing a circuit of a conventional frequency separator which comprises a low-pass filter and a high-pass filter. FIGS. 11 and 12 are block diagrams showing other conventional frequency separators disclosed in Japanese Patent Laid-Open No. 3-216002. The frequency separator of FIG. 11 corresponds to that of FIG. 10 which has an additional low-pass filter connected to the high-pass filter. The frequency separator of FIG. 12 corresponds to that of FIG. 11 in which a rejection filter is added to each of the low-pass filter and the high-pass filter.

Generally, these frequency separators have a dielectric coaxial resonator which comprises a dielectric ceramic cylinder having electrodes formed on both the inner and outer surface of the cylinder. Due to this structure, it has been difficult to reduce the size of the frequency separator.

The recent spread of the handy phone is striking, and many efforts are directed to improve the performance of portable terminal equipment. For example, a dual-band handy phone, which enables speech in two different frequency bands, has been proposed. The dual-band handy phone must have a device for selecting one from the two frequency bands, i.e., a frequency separator. Also, such a frequency separator must be small in size to be mounted in a portable terminal equipment.

FIG. 13 is a graph showing insertion loss of a frequency separator, having a conventional branching circuit shown in FIG. 10, for use in a dual-band telephone using two bands of f1=824 to 894 MHz and f2=1850 to 1990 MHz. As seen from FIG. 13, the attenuation is as small as 5 to 10 dB in both bands, and therefore, little amount of one band signal does not run around into the other band. Thus, the conventional frequency separator has been insufficient in branching one band signal f1 and the other band signal f2.

By the constructions shown in FIGS. 11 and 12, the insertion loss can be decreased with respect to each of the f1 and f2 bands. However, these constructions are rather complicated, and therefore, frequency separators having such constructions are inevitably large in size. Since the frequency separator to be mounted in a handy phone is required to be as small in size as possible and be of high performance, the conventional frequency separator of large size is apparently not suitable for a handy phone.

OBJECT AND SUMMARY OF THE INVENTION

Accordingly, an object of the present invention is to provide a high performance frequency separator having a novel construction and being small in size.

As a result of the intense research in view of the above objects, the inventors have found that good branching characteristics can be attained by making the frequency separator with simple circuits into a multilayered structure, and further found that the size of the frequency separator can be reduced by the multilayered structure.

Thus, in a first aspect of the present invention, there is provided a multilayered frequency separator comprising a plurality of insulating layers, having at least two notch circuits each of which notch circuits comprises a capacitor component connected to an inductance component, the at least two notch circuits being constituted by pattern electrodes formed on interface of each of the insulating layers, and the at least two notch circuits being interconnected in parallel with respect to an input terminal. The capacitor component comprises at least one capacitor, and also, the inductance component comprises at least one inductor.

In the present invention, a low pass filter which is constituted by pattern electrodes on each of the interfaces may be connected to an output terminal of one notch circuit, and a high pass filter which is constituted by pattern electrodes on each of the interfaces may be connected to an output terminal of another notch circuit.

The multilayered frequency separator of the present invention may have either one of the low pass filter and the high pass filter.

In the present invention, the notch circuit is preferred to comprise an inductance component and a capacitor component interconnected in parallel. However, both the components may be interconnected in series.

The low pass filter may comprise a capacitor component connected between the output terminal of the notch circuit and the earth. However, the low pass filter is not restricted to such a construction.

The high pass filter may comprise an inductance component connected between the output terminal of the notch circuit and the earth, and a capacitor component connected to the output terminal in series. However, the high pass filter is not restricted to such a construction.

The multilayered frequency separator of the present invention may be mounted in a dual-band handy phone by connecting the input terminal to an antenna of the dual-band handy phone, and each of the output terminals of the notch circuits to each communication circuit corresponding to two frequency bands of the dual-band handy phone.

The pattern electrode for the inductance component is preferred to be in the form of meander line, and may be in the form of spiral line. The capacitor component may be constituted by the pattern electrodes opposite to each other, and the capacity may be adjusted by regulating the area of the electrodes and the distance between the opposed electrodes.

DETAILED DESCRIPTION OF THE INVENTION

By referring to the attached drawings, the present invention will be described below in more detail.

Figure 1:
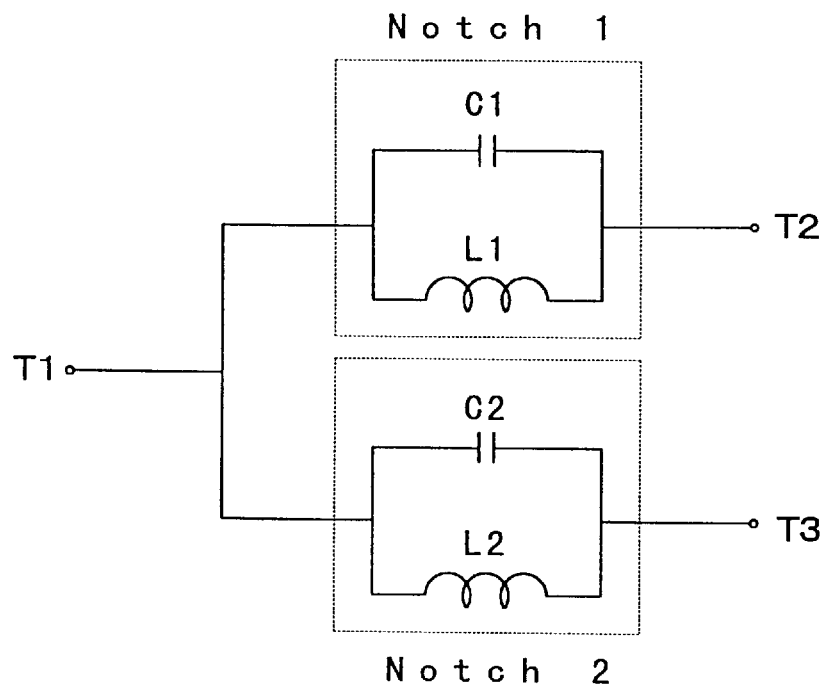
FIG. 1 is a schematic diagram showing an equivalent circuit A of a multilayered frequency separator of the present invention.

The equivalent circuit A of a first preferred embodiment according to the present invention is shown in FIG. 1. The first embodiment of the multilayered frequency separator includes a notch circuit 1 comprising an inductance component L1 and a capacitor component C1 connected in parallel, and a notch circuit 2 comprising an inductance component L2 and a capacitor component C2 connected in parallel. One terminal of the notch circuit 1 is connected to one terminal of the notch circuit 2 in parallel with respect to a terminal (T1) to construct a frequency separator circuit. If a signal of the band (f1) is intended to pass from the terminal (T1) to the terminal (T2), the insertion loss in the notch circuit 2 is so regulated as to be the largest against the frequency of the band (f1) to gain no output signal from the terminal (T3). On the other hand, if a signal of the band (f2) is intended to pass from the terminal (T1) to the terminal (T3), the insertion loss in the notch circuit 1 is so regulated as to be the largest against the frequency of the band (f2) to gain no output signal from the terminal (T2). In this manner, the signal input to the terminal (T1) is branched.

Figure 2:
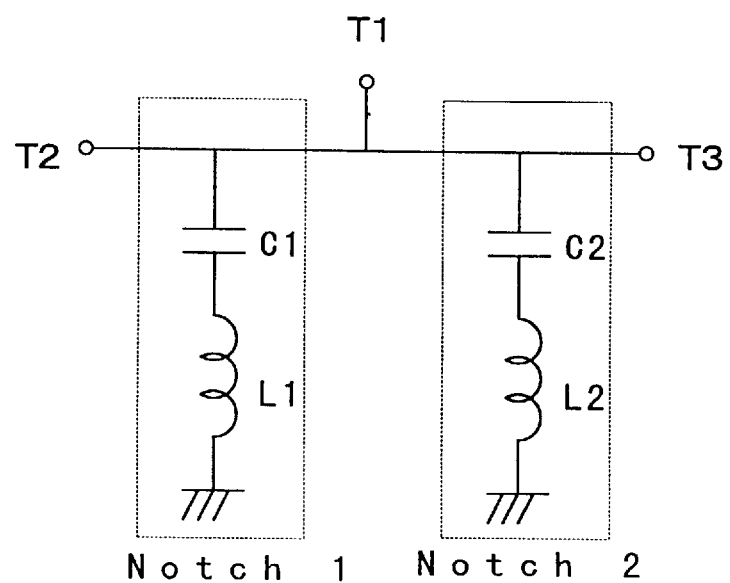
FIG. 2 is a schematic diagram showing an equivalent circuit B of another multilayered frequency separator of the present invention.

The equivalent circuit B of a second preferred embodiment according to the present invention is shown in FIG. 2. The second embodiment of the multilayered frequency separator includes a notch circuit 1 comprising an inductance component L1 and a capacitor component C1 interconnected in series, and a notch circuit 2 comprising an inductance component L2 and a capacitor component C2 interconnected in series. One terminal of the notch circuit 1 is connected to one terminal of the notch circuit 2 in parallel with respect to a terminal (T1) to construct a frequency separator circuit. If a signal of the band (f1) is intended to pass from the terminal (T1) to the terminal (T2), the insertion loss in the notch circuit 2 is so regulated as to be the largest against the frequency of the band (f1) to gain no output signal from the terminal (T3). On the other hand, if a signal of the band (f2) is intended to pass from the terminal (T1) to the terminal (T3), the insertion loss in the notch circuit 1 is so regulated as to be the largest against the frequency of the band (f2) to gain no output signal from the terminal (T2). In this manner, the signal input to the terminal (T1) is branched.

Figure 3:
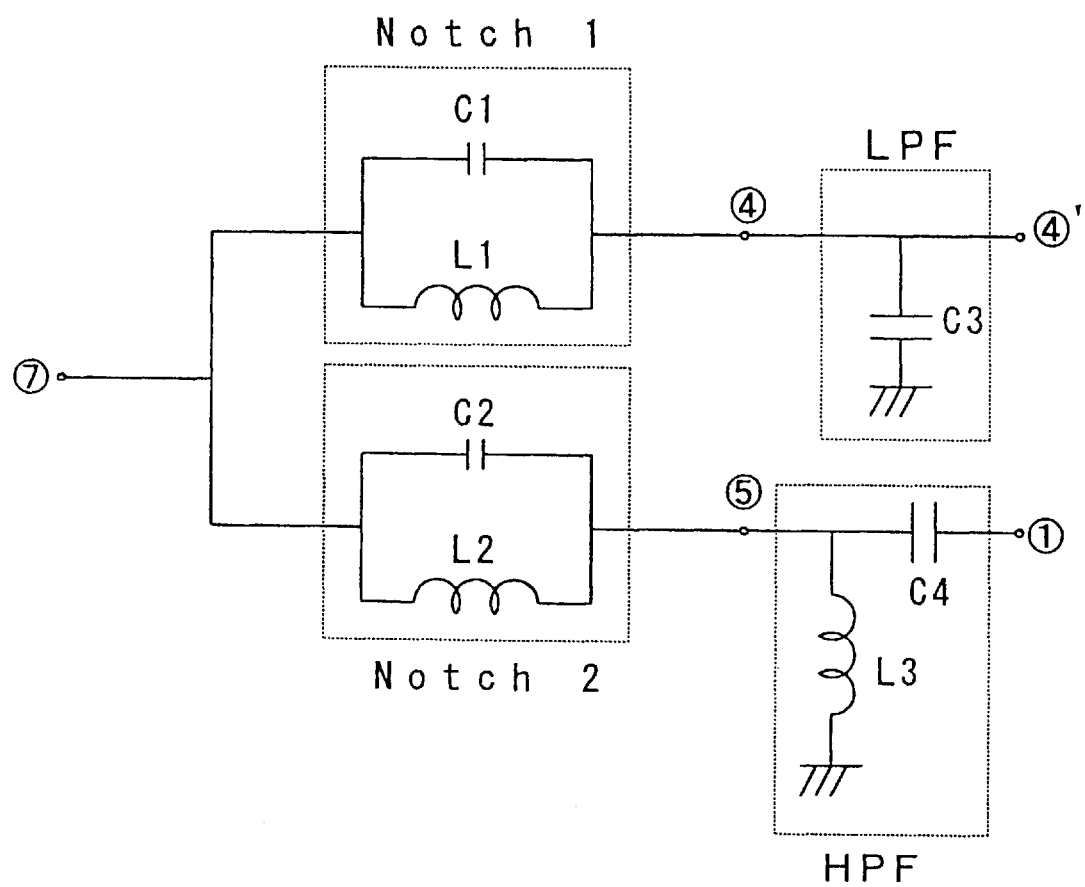
FIG. 3 is a schematic diagram showing an equivalent circuit C of still another multilayered frequency separator of the present invention.

The equivalent circuit C of a third preferred embodiment according to the present invention is shown in FIG. 3. The third embodiment of the multilayered frequency separator includes, as a main circuit, a notch circuit 1 comprising an inductance component L1 and a capacitor component C1 interconnected in parallel, and a notch circuit 2 comprising an inductance component L2 and a capacitor component C2 also interconnected in parallel. The main circuit of FIG. 3 is the same as the equivalent circuit of FIG. 1. One terminal of the notch circuit 1 is connected to one terminal of the notch circuit 2 in parallel with respect to the first external terminal ⑦. The other terminal of each of the notch circuit 1 and the notch circuit 2 is referred to as a second terminal ④, and a third terminal ⑤, respectively. A capacitor component C3 is connected between the second terminal ④ and the earth to construct a low pass filter circuit. A capacitor component C4 is connected to the third terminal ⑤ in series, and an inductance component L3 is connected between the third terminal ⑤ and the earth, thereby constructing a high pass filter circuit. In this frequency separator circuit, the first terminal ⑦, the other terminal ④' of the low pass filter, and the terminal ① of the high pass filter serve as input-output terminals.

If a signal of the band (f1) is intended to pass from the terminal ⑦ to the terminal ④', the insertion loss in the notch circuit 2 is so regulated as to be the largest against the frequency of the band (f1) to gain no output signal from the terminal ①. On the other hand, if a signal of the band (f2) is intended to pass from the terminal ⑦ to the terminal ①, the insertion loss in the notch circuit 1 is so regulated as to be the largest against the frequency of the band (f2) to gain no output signal from the terminal ④'.

Basically, the multilayered frequency separator of the present invention comprises 4 to 13 insulating layers. As the material for each insulating layer, a dielectric ceramic material which can be sintered at about 950° C. or lower is preferably used. The dielectric constant of the dielectric material is preferably 5 to 40. The dimension and the geometrical shape of each insulating layer and the multilayered frequency separator are not strictly limited as far as the object of the present invention is accomplished. Usually, the insulating layer is a rectangular sheet having a thickness of 0.05 to 0.70 mm, a length of 2.0 to 4.5 mm and a width of 1.2 to 3.2 mm. The height of the multilayered frequency separator is preferably 1.0 to 1.7 mm. On the surface of each insulating layer, pattern electrodes for the capacitor component or the inductance component is formed, for example, by screen-printing a silver paste. The uppermost and lowermost insulating layers may be formed no pattern electrode.

Each of the insulating layer (ceramic green sheet) is laminated by a known method to construct a multilayer structure having a plurality of the insulating layers. The multilayer structure is then sintered at 950° C. or lower, preferably 850° C. to 950° C. for 1 to 5 hours in an atmosphere such as air, $N_2$, $N_2+H_2$, etc. to obtain an integral laminate. Then, terminal electrodes are formed on the side surface of the integral laminate to produce the multilayered frequency separator of the present invention.

Figure 4:
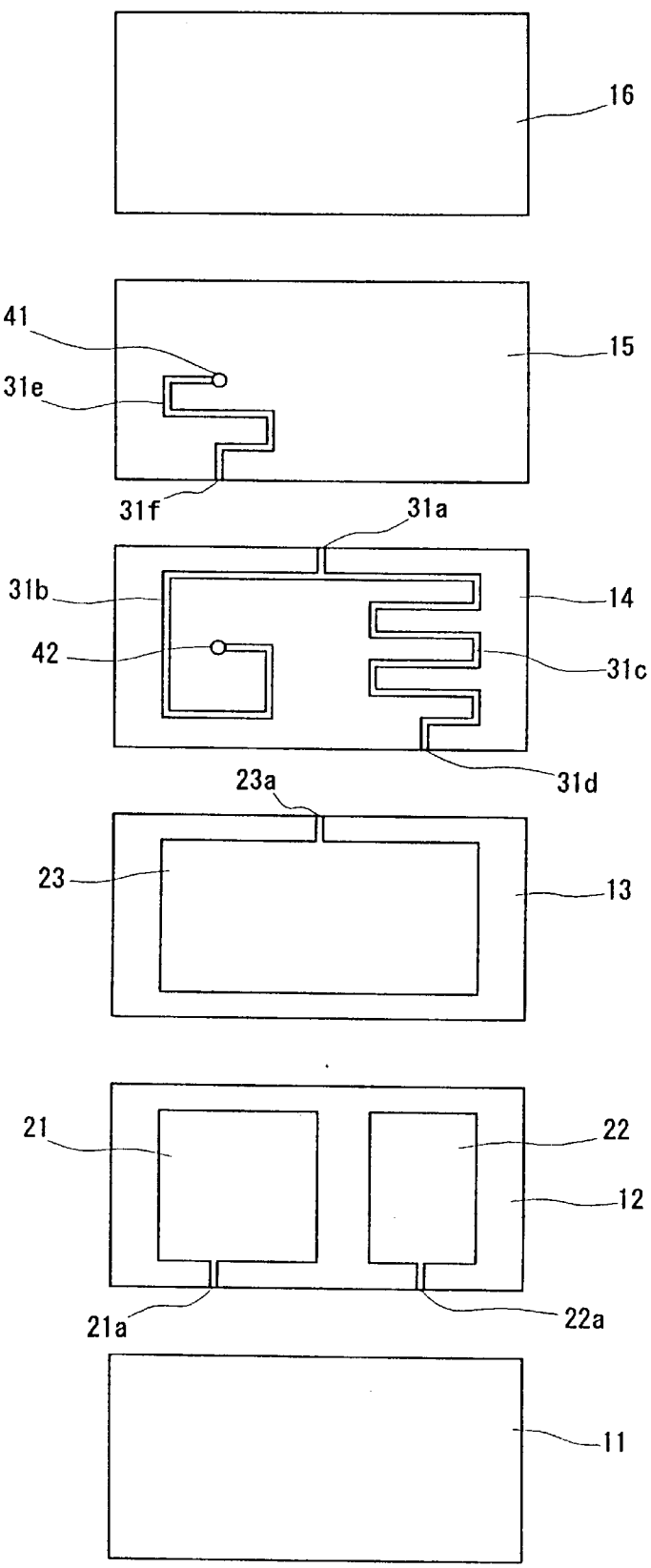
FIG. 4 is a schematic illustration showing each insulating layer constructing a multilayered frequency separator having the circuit of FIG. 1.
Figure 5:
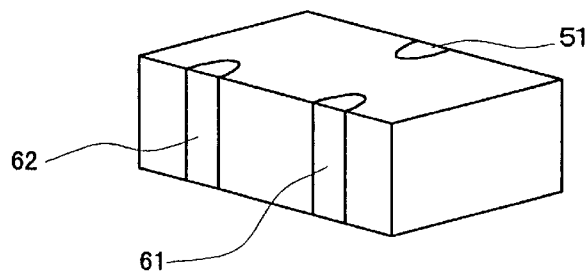
FIG. 5 is a cross-eye view of the multilayered frequency separator of FIG. 4.
Figure 10:
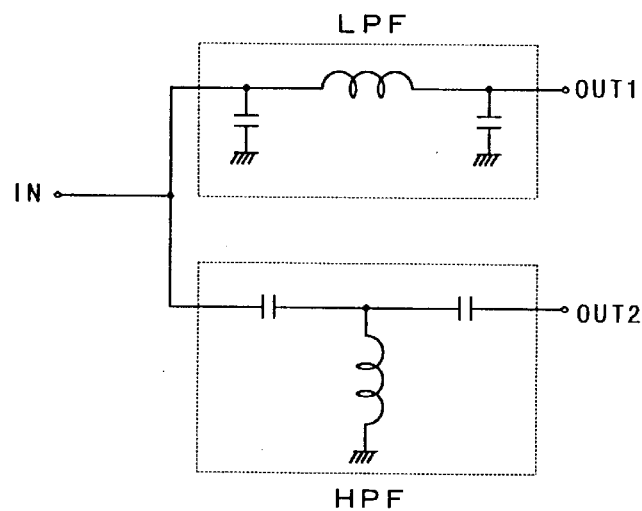
FIG. 10 is a schematic diagram showing an equivalent circuit of a conventional frequency separator.
Figure 11:
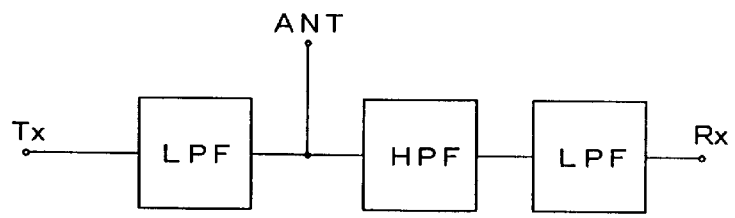
FIG. 11 is a schematic illustration showing a block diagram of another conventional frequency separator.
Figure 12:
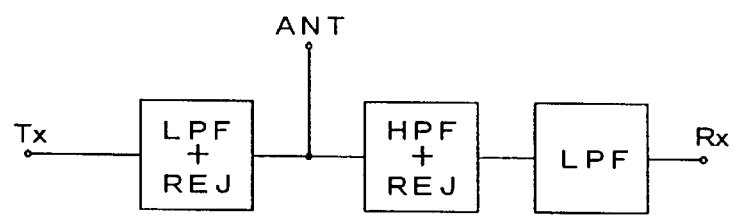
FIG. 12 is a schematic illustration showing a block diagram of still another conventional frequency separator.

FIG. 4 is a schematic illustration showing each insulating layer of a chip multilayered frequency separator of the first preferred embodiment, and a cross-eye view thereof is shown in FIG. 5. The multilayered frequency separator shown in FIGS. 4 and 5 has the equivalent circuit A of FIG. 1 and a dimension of 4.5 mm×3.2 mm×1.7 mm (height).

Referring to FIG. 4, an insulating layer (ceramic green sheet having a dielectric constant of 8) 11 having no pattern electrode on the surface thereof constitutes the lowermost layer of the frequency separator. On the insulating layer 11, an insulating layer 12 having pattern electrodes 21 and 22 for the capacitor component. Lead electrodes 21a and 22a extending from each of the pattern electrodes 21 and 22 are exposed on an edge surface of the insulating layer 12. On an insulating layer 13 to be laminated on the insulating layer 12, a pattern electrode 23 for the capacitor component is formed. A lead electrode 23a extending from the pattern electrode 23 is exposed on an edge surface of the insulating layer 13. On an insulating layer 14 to be laminated on the insulating layer 13, pattern electrodes for the inductance component are formed. A line electrode extending from a lead electrode 31a on an edge surface branches to line electrodes 31b and 31c for the inductance component. The end of the line electrode 31b is made into a through-hole round electrode 42, and the line electrode 31c extends to the opposite edge surface to form a lead electrode 31d thereon. On an insulating layer 15 to be laminated on the insulating layer 14, a line electrode 31e is formed. One end of the line electrode 31e extends to an edge surface of the insulating layer 15 and forms a lead electrode 31f. The other end of the line electrode 31e is made into a through-hole electrode 41. The uppermost insulating layer 16 having no pattern electrode is laminated on the insulating layer 15. The multilayer structure thus obtained is sintered, for example, at 900° C. to give an integral laminate.

As shown in FIG. 5, terminal electrodes 51, 61 and 62 are formed on the side surfaces of the laminate. The line electrodes 31e and 31b are interconnected through the through-hole electrode 41 and the through-hole round electrode 42, and constitute an inductance component. The line electrodes 31a and 23a are exposed on the same side surface of the multilayer structure, and interconnected by the terminal electrode 51. The lead electrodes 31f and 21a, which are exposed on the same side surface of the multilayer structure, are interconnected by the terminal electrode 62. Further, the lead electrodes 31d and 22a on the same side surface of the multilayer structure are interconnected by the terminal electrode 61.

Comparing FIG. 1 with FIG. 4, C1 is constituted by the pattern electrodes 22 and 23, L1 by the line electrode 31c, C2 by the pattern electrodes 21 and 23, and L2 by the line electrodes 31b and 31e.

The first embodiment had the capacitance and the inductance of C1=1.6 pF, L1=4 nH, C2=3.2 pF, and L2=10 nH, and was confirmed to be suitable for a frequency separator of a dual-band handy phone using a frequency band (f1) of 824 to 894 MHz and a frequency band (f2) of 1850 to 1990 MHz.

Figure 6:
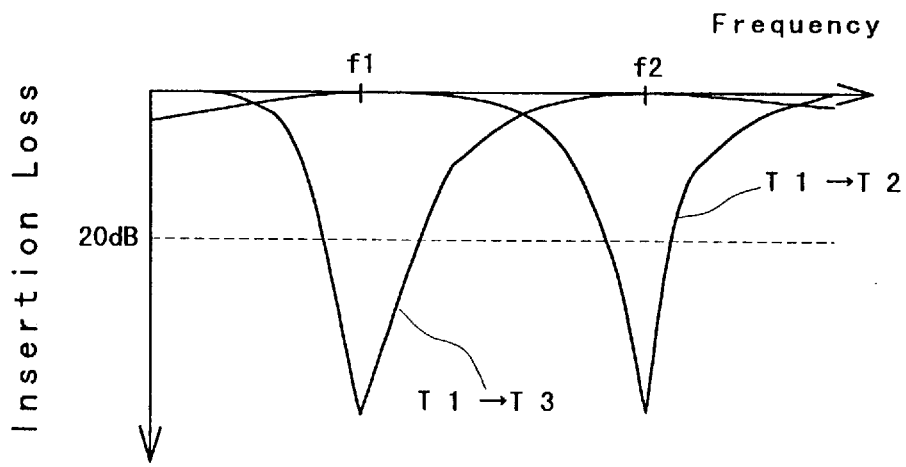
FIG. 6 is a graph showing insertion loss characteristics of a multilayered frequency separator having the circuit of FIG. 1.
Figure 13:
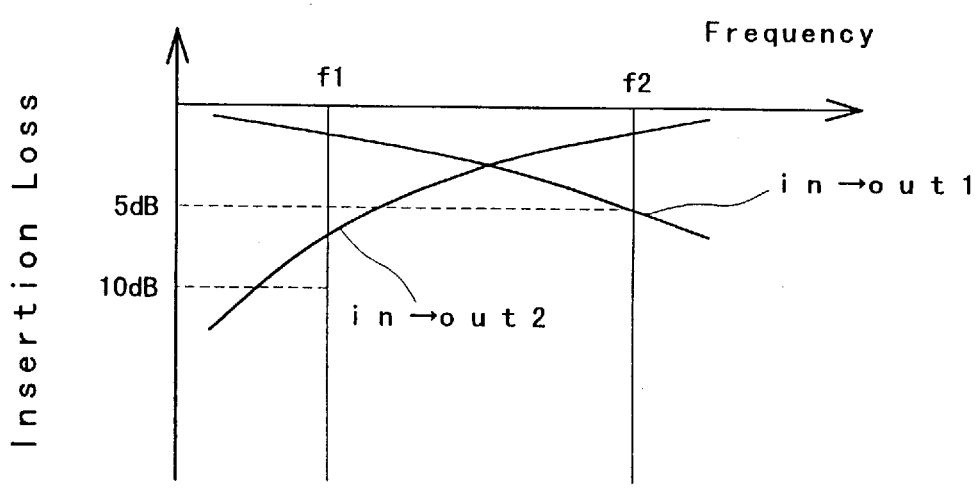
FIG. 13 is a graph showing insertion loss characteristics of the conventional frequency separator having the circuit of FIG. 10.

FIG. 6 is a graph showing insertion loss characteristics of the first embodiment of the multilayered frequency separator in which f1 and f2 were set to 860 MHz and 1920 MHz, respectively. As seen from FIG. 6, the attenuation is far larger than 15 dB, and little amount of one band signal runs around to the other band, and therefore, the multilayered frequency separator of the present invention has excellent performance in branching the bands.

Figure 7:
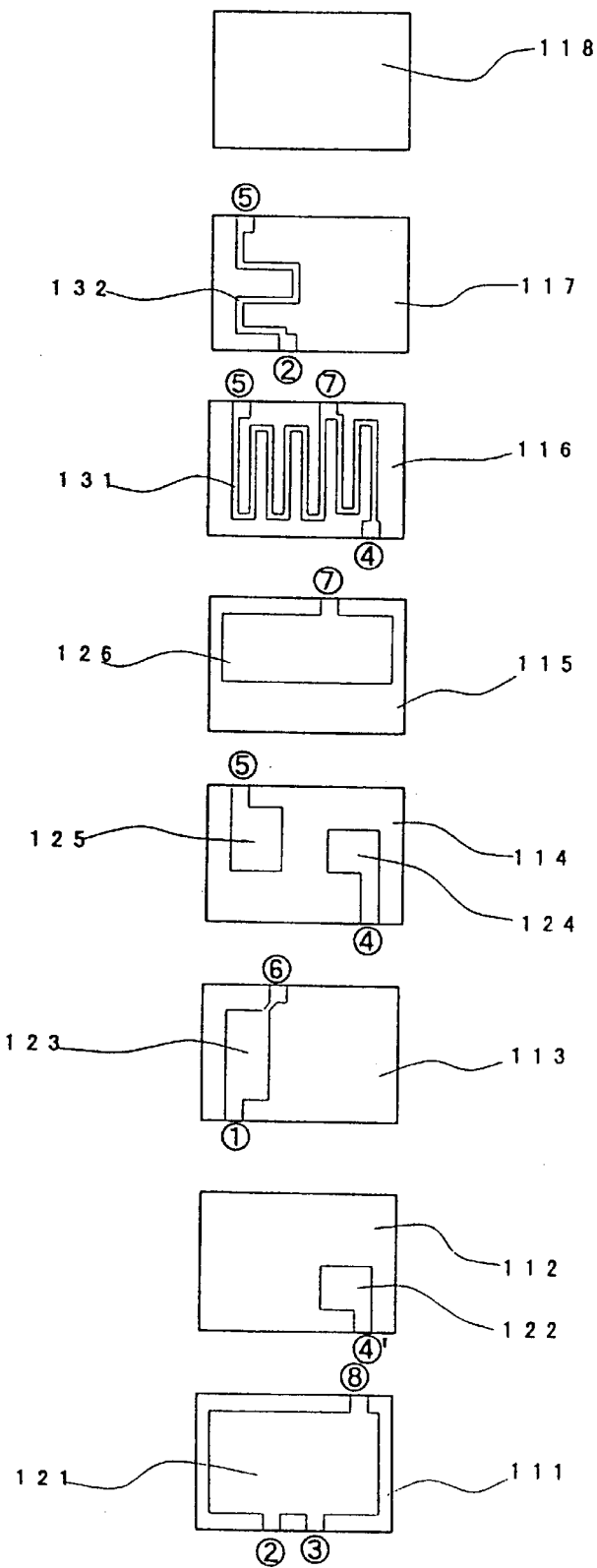
FIG. 7 is a schematic illustration showing each insulating layer constructing a multilayered frequency separator having the circuit of FIG. 3.
Figure 8:
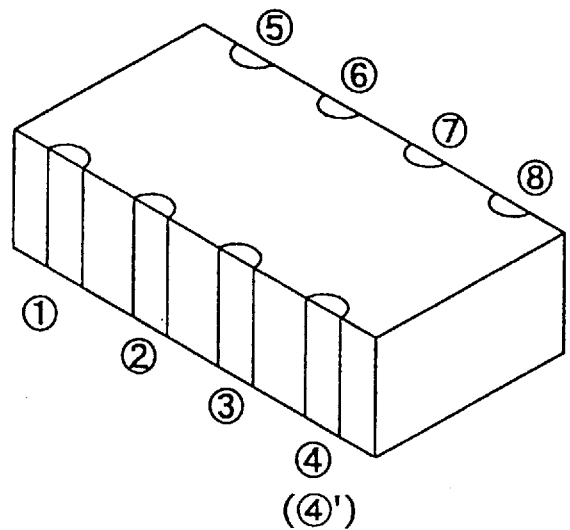
FIG. 8 is a cross-eye view of the multilayered frequency separator of FIG. 7.

FIG. 7 is a schematic illustration showing each insulating layer of a chip multilayered frequency separator of the second preferred embodiment, and a cross-eye view thereof is shown in FIG. 8. The multilayered frequency separator shown in FIGS. 7 and 8 has the equivalent circuit C of FIG. 3 and a dimension of 4.5 mm×3.2 mm×1.7 mm (height).

On an insulating layer 111 constituting the lowermost layer, a pattern electrode 121 for the capacitor component is formed. A part of the pattern electrode 121 extends to be connected to each of external terminals ②, ③ and ⑧. On the insulating layer 111, an insulating layer 112 having a pattern electrode 122 for the capacitor component is laminated. A part of the pattern electrode 122 extends to be connected to an external terminal ④'. An insulating layer 113 having thereon a pattern electrode 123 for the capacitor component is laminated on the insulating layer 112. A part of the electrode 123 extends to be connected to each of external terminals ① and ⑥. On the insulating layer 113, is laminated an insulating layer 114 having pattern electrodes 124 and 125 for the capacitor component, each pattern electrode extending to be connected external terminals ④' and ⑤, respectively. An insulating layer 115 having thereon a pattern electrode 126 for the capacitor component is laminated on the insulating layer 114. The pattern electrode partially extends to be connected to an external terminal ⑦. On an insulating layer 116 to be laminated on the insulating layer 115, a pattern electrode 131 for the inductance component is formed in the form of meander line. The pattern electrode 131 is connected to external terminals ④ and ⑤ at both the ends thereof, and to an external terminal ⑦ at an intermediate portion. On the insulating layer 116, an insulating layer 117 having thereon a pattern electrode 132 for the inductance component is laminated. The pattern electrode 132 is in the form of meander line, and connected to external terminals ② and ⑤ at both the ends thereof. An insulating layer 118 having no pattern electrode is laminated on the insulating layer 117 to constitute the uppermost layer. The multilayer structure thus obtained is sintered, for example, at 900° C. to give an integral laminate.

As seen from FIG. 8, terminal electrodes for the external terminals ① to ⑧ are formed on the side surfaces of the laminate.

Comparing FIG. 3 with FIG. 7, L1 and L2 are constituted by the pattern electrode 131, C1 by the pattern electrodes 124 and 126, and C2 by the pattern electrodes 125 and 126, thereby constructing two notch circuits. Further, the pattern electrodes 122 and 121 constitute C3 of the low pass filter. The pattern electrodes 123 and 125 constitute C4 and the pattern electrode 132 constitutes L3 of the high pass filter.

In this second embodiment, the capacitance and the inductance were selected as follows: C1=1.6 pF, L1=4 nH, C2=3.2 pF, L2=10 nH, C3=1.3 pF, C4=2.8 pF, and L3=4 nH. It was confirmed that the multilayered frequency separator of the second embodiment was suitable for a frequency separator of a dual-band handy phone using a frequency band (f1) of 824 to 894 MHz and a frequency band (f2) of 1850 to 1990 MHz.

Figure 9:
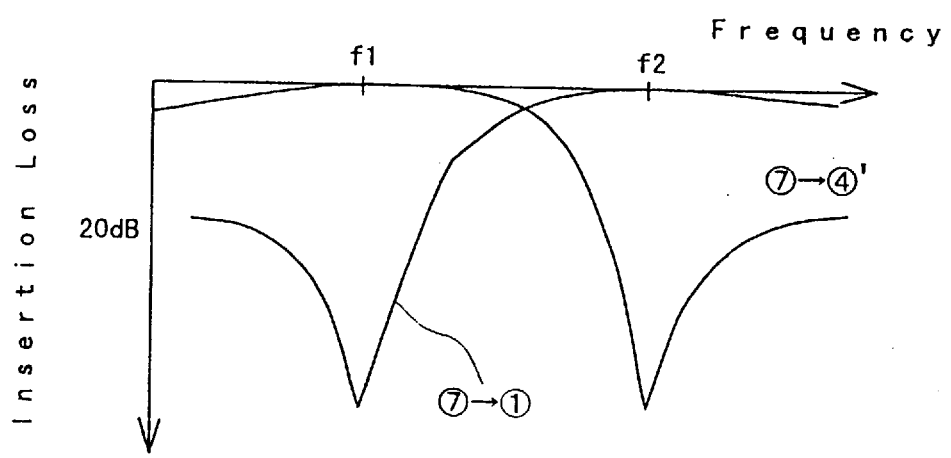
FIG. 9 is a graph showing insertion loss characteristics of a multilayered frequency separator having the circuit of FIG. 3.

FIG. 9 is a graph showing insertion loss characteristics of the second embodiment of the multilayered frequency separator in which f1 and f2 were set to 860 MHz and 1920 MHz, respectively. As seen from FIG. 9, the attenuation is far larger than 20 dB, and little amount of one band signal runs around to the other band, and therefore, the multilayered frequency separator of the present invention has excellent performance in branching the bands. In the present invention, the attenuation of 20 dB or larger, preferably 20 to 35 dB can be attained.

In the second embodiment, the pattern electrode 123 constituting C4 of the high pass filter is connected to the external terminals ① and ⑥ at both the ends thereof. As seen from the equivalent circuit C of FIG. 3, the pattern electrode 123 is needed to be connected to only the external terminal ①. The terminal electrodes are formed on each of the external terminals ① to ⑧ by printing a silver paste, baking and plating such as electroplating. When an external terminal to be plated is isolated (dummy terminal), the deposit thickness, in particular in electroplating, is reduced as compared with the deposit thickness of other external terminals connected to anywhere. To eliminate this problem, the external terminal ⑥ was connected to the pattern electrode 123, because such a connection had no influence in the characteristics of the circuit.

While the invention has been particularly shown and described with reference to the preferred embodiments thereof, it will be understood by those skilled in the art that various other changes in the form and details may be made therein without departing from the spirit and scope of the present invention.

For example, the pattern electrode for the inductance component may be made in the form other than meander line, for example, spiral line, and the inductance component may be constituted by pattern electrodes on a plurality of insulating layers interconnected by one or more through-hole electrodes. Also, the capacitor component may be constituted by pattern electrodes on three or more insulating layers being opposite to each other in place of pattern electrodes on two insulating layers as describe above.

Although, the low pass filter and the high pass filter were used in the second preferred embodiment, either one of the two may be used alone. The frequency separator circuit is mainly constituted by the combination of the notch circuits, and low or high pass filter is used to further improving the branching characteristics. In some cases, the use of only one of two is sufficient for the purpose. For example, when the insulating layers 111 and 112 of FIG. 7 are omitted, the resulting frequency separator includes only the high pass filter. When the insulating layers 113 and 117 are removed, the resulting frequency separator has only the low pass filter.

As described above, according to the present invention, a frequency separator with a high performance can be obtained from using a rather simple circuit. Also, the simple circuits and the multilayer structure can reduce the size of the frequency separator, and therefore, the multilayered frequency separator of the present invention can be suitably applied to a small-sized microwave equipment, in particular, to a dual-band handy phone.

What is claimed is:

1. A multilayered frequency separator comprising a plurality of insulating layers having thereon pattern electrodes constituting a frequency separator circuit, said frequency separator circuit comprising:

a first notch circuit and a second notch circuit each of which comprises a capacitor component and an inductance component in parallel, one end of said first notch circuit being interconnected in parallel to one end of said second notch circuit to form a first terminal, and the other ends of said first and second notch circuits forming a second terminal and a third terminal; and an inductance component connected between one of said second and third terminals and ground;

said first terminal being connected to an antenna of a dual-band handy phone, and each output terminal of said two notch circuits being connected to each communication circuit of two frequency bands.

2. The multilayered frequency separator according to claim 1, wherein said frequency separator circuit further comprises a capacitor component connected in series to said one of second and third terminals.

3. The multilayered frequency separator according to claim 1, wherein said frequency separator circuit further comprises a capacitor component connected between the other of said second and third terminals and ground.

4. The multilayered frequency separator according to claim 1, wherein said plurality of insulating layers having thereon pattern electrodes are laminated so that said pattern electrodes are laminated from a lower side to an upper side in the order of a ground electrode, a capacitor electrode for said capacitor component and an inductance electrode for said inductance component.

5. The multilayered frequency separator according to claim 1, wherein an inductance electrode for said grounded inductance component is formed at an upper side of the pattern electrodes for said two notch circuits.

6. The multilayered frequency separator according to claim 1, having a height of 1.0 to 1.7 mm and length/width dimensions of 2.0 to 4.5 mm×1.2 to 3.2 mm.

7. A multilayered frequency separator comprising a plurality of insulating layers having thereon pattern electrodes, and having at least two notch circuits each of which comprises a capacitor component and an inductance component in parallel or series, said at least two notch circuits being constituted by pattern electrodes formed on interfaces of each of said insulating layers, and said at least two notch circuits being interconnected in parallel with respect to an input terminal, wherein a pattern electrode for ground, a pattern electrode for said capacitor component and a pattern electrode for said inductance component are separately formed on respective insulating layers and laminated in said order from a lower side to an upper side.

8. The multilayered frequency separator according to claim 7, having a height of 1.0 to 1.7 mm and length/width dimensions of 2.0 to 4.5 mm×1.2 to 3.2 mm.

9. The multilayered frequency separator according to claim 7, wherein an inductor component is connected between ground and an output terminal of one of said at least two notch circuits.

10. The multilayered frequency separator according to claim 9, wherein a capacitor component is connected in series to said output terminal.

11. The multilayered frequency separator according to claim 9, wherein a capacitor component is connected between ground and an output terminal of another of said at least two notch circuits.

12. The multilayered frequency separator according to claim 9, wherein an inductance electrode for said grounded inductance component is formed at the upper side of the pattern electrodes for said at least two notch circuits.

13. The multilayered frequency separator according to claim 7, wherein said input terminal is connected to an antenna of a dual-band handy phone, and each of output terminals of said at least two notch circuits is connected to each communication circuit of two frequency bands.

14. A multilayered frequency separator comprising a plurality of insulating layers having thereon pattern electrodes constituting a frequency separator circuit, said frequency separator circuit comprising:

a first notch circuit and a second notch circuit each of which comprises a capacitor component and an inductance component in parallel, one end of said first notch circuit being interconnected in parallel to one end of said second notch circuit to form a first terminal, and the other ends of said first and second notch circuits forming a second terminal and a third terminal;

an inductance component connected between one of said second and third terminals and ground; and a capacitor component connected between the other of said second and third terminals and ground.

15. The multilayered frequency separator according to claim 14, wherein said frequency separator circuit further comprises a capacitor component connected in series to said one of second and third terminals.

16. The multilayered frequency separator according to claim 14, wherein said plurality of insulating layers having thereon pattern electrodes are laminated so that said pattern electrodes are laminated from a lower side to an upper side in the order of a ground electrode, a capacitor electrode for said capacitor component and an inductance electrode for said inductance component.

17. The multilayered frequency separator according to claim 14, wherein an inductance electrode for said grounded inductance component is formed at an upper side of the pattern electrodes for said two notch circuits.

18. The multilayered frequency separator according to claim 14, having a height of 1.0 to 1.7 mm and length/width dimensions of 2.0 to 4.5 mm×1.2 to 3.2 mm.

19. The multilayered frequency separator according to claim 14, wherein said first terminal is connected to an antenna of a dual-band handy phone, and each of output terminals of said two notch circuits is connected to each communication circuit of two frequency bands.

* * * * *